United States Patent
Laur et al.

(10) Patent No.: US 10,768,678 B2
(45) Date of Patent: *Sep. 8, 2020

(54) METHOD AND SYSTEM FOR REDUCING TRANSIENTS IN DC-DC CONVERTERS

(71) Applicant: Intersil Americas LLC, Milpitas, CA (US)

(72) Inventors: Steven Laur, Raleigh, CA (US); Daniel Zheng, Morrisville, CA (US)

(73) Assignee: Intersil Americas LLC, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/125,678

(22) Filed: Sep. 8, 2018

(65) Prior Publication Data

US 2019/0004577 A1  Jan. 3, 2019

Related U.S. Application Data

(63) Continuation of application No. 15/016,408, filed on Feb. 5, 2016, now Pat. No. 10,073,507.

(Continued)

(51) Int. Cl.
*G06F 1/26* (2006.01)
*H02M 3/158* (2006.01)
(Continued)

(52) U.S. Cl.
CPC .............. *G06F 1/26* (2013.01); *H02M 3/158* (2013.01); *H03K 7/08* (2013.01); *H02M 1/15* (2013.01); *H02M 2001/0022* (2013.01)

(58) Field of Classification Search
CPC .. H02M 1/15; H02M 2001/0009; H02M 1/36; H02M 2001/0025;
(Continued)

(56) References Cited

U.S. PATENT DOCUMENTS 6,166,528 A    12/2000 Rossetti et al.
6,853,174 B1   2/2005 Inn
(Continued)

FOREIGN PATENT DOCUMENTS

CN    1784930 A      6/2006
CN    102106067 A    6/2011
CN    103220859 A    7/2013

OTHER PUBLICATIONS

Keeping, Steven. "Voltage- and Current-Mode Control for PWM Signal Generation in DC-to-DC Switching Regulators." DigiKey, Electronic Products, Oct. 1, 2014, www.digikey.com/en/articles/techzone/2014/oct/voltage-and-current-mode-control-for-pwm-signalgeneration-in-dc-to-dc-switching-regulators. (Year: 2014).*

(Continued)

*Primary Examiner* — Jaweed A Abbaszadeh
*Assistant Examiner* — Brian J Corcoran
(74) *Attorney, Agent, or Firm* — Foley & Lardner LLP

(57) ABSTRACT

One embodiment pertains to a method including determining the duty cycle of a PWM signal, operating in valley current control mode when the duty cycle is greater than fifty percent, operating in peak current control mode when the duty cycle is less than fifty percent, and including, commencing a PWM pulse upon the occurrence of a pulse of a first clock signal pulse, and terminating the PWM pulse upon a level of a signal exceeding a positive window threshold.

17 Claims, 5 Drawing Sheets

Related U.S. Application Data

(60) Provisional application No. 62/221,714, filed on Sep. 22, 2015, provisional application No. 62/259,246, filed on Nov. 24, 2015.

(51) Int. Cl.
*H03K 7/08* (2006.01)
*H02M 1/15* (2006.01)
*H02M 1/00* (2006.01)

(58) Field of Classification Search
CPC . H02M 2001/0032; H02M 2001/0058; H02M 3/1586; H02M 3/156; H02M 3/157; H02M 3/1584; H02M 3/1582; H02M 3/33507; G05F 1/46; H03K 7/08; G06F 1/26

See application file for complete search history.

(56) References Cited

U.S. PATENT DOCUMENTS

| | | | |
|---|---|---|---|
| 7,755,341 B2 | 7/2010 | Philbrick | |
| 8,154,268 B2 | 4/2012 | Philbrick et al. | |
| RE43,414 E | 5/2012 | Walters et al. | |
| 8,305,055 B2 | 11/2012 | Wu et al. | |
| 8,564,259 B2 | 10/2013 | Chen et al. | |
| 8,896,279 B2 | 11/2014 | Wu et al. | |
| 8,988,055 B2 * | 3/2015 | Buthker | H02M 3/156 323/282 |
| 9,024,610 B2 | 5/2015 | Philbrick et al. | |
| 2009/0009148 A1 | 1/2009 | Philbrick | |
| 2009/0315523 A1 * | 12/2009 | Kumagai | H02M 3/156 323/272 |
| 2010/0253313 A1 | 10/2010 | Herzer et al. | |
| 2011/0227550 A1 | 9/2011 | Walters et al. | |
| 2013/0249511 A1 | 9/2013 | Kalje et al. | |
| 2014/0055107 A1 | 2/2014 | Tsuruoka et al. | |
| 2016/0065062 A1 | 3/2016 | Teh et al. | |

OTHER PUBLICATIONS

Richard Redl et al., "Current-Mode Control, Five Different Types, Used with the Three Basic Classes of Power Converters: Small-Signal AC and Large-Signal DC Characterization, Stability Requirements, and Implementation of Practical Circuits", Proc. IEEE PESC 1985 Conference, 1985, pp. 771-785, retrieved from http://ieeexplore.ieee.org/stamp/stamp.jsp?amumber=7071020.

Xiaoming Duan et al., "Current-Mode Variable-Frequency Control Architecture for High-Current Low-Voltage DC-DC Converters", IEEE Transactions on Power Electronics, vol. 21, No. 4, Jul. 2006, pp. 1133-1137.

Yanzhao MA et al., "An automatic peak-valley current mode step-up/step-down DC-DC converter with smooth transition." ASIC (ASICON), 2013 IEEE 10th International Conference on. IEEE, 2013.

Du et al., "A 5-MHz 91% Peak-Power-Efficiency Buck Regulator With Auto-electable Peakand Valley-Current Control", Lee Journal of Solid State Circuits, vol. 46, No. 8, Aug. 2011, pp. 1928-1939.

Office Action for CN Application No. 201610836649.6 dated Dec. 4, 2019, 19 pages (English Translation).

* cited by examiner

METHOD AND SYSTEM FOR REDUCING TRANSIENTS IN DC-DC CONVERTERS

CROSS-REFERENCE TO RELATED APPLICATIONS

This application is a continuation of U.S. patent application Ser. No. 15/016,408 filed Feb. 5, 2016, now U.S. Pat. No. 10,073,507, which application claims the benefit of provisional U.S. Patent Application Ser. No. 62/221,714 filed Sep. 22, 2015 and provisional U.S. Patent Application Ser. No. 62/259,246 filed Nov. 24, 2015, all of which are incorporated herein by reference in their entirety.

It should be noted that some details of the Figures have been simplified and are drawn to facilitate understanding of the inventive embodiments rather than to maintain strict structural accuracy, detail, and scale. It should also be noted that not all circuit elements and operating steps are illustrated, as the general methods of circuit design and operation are well known. It should also be noted that not all details about voltage converters are illustrated, as general designs of voltage converters are well known.

DESCRIPTION OF THE EMBODIMENTS

Embodiments relate generally to transient reduction in DC-DC converters when such converters transition between peak and valley current control mode operation.

Figure 1:
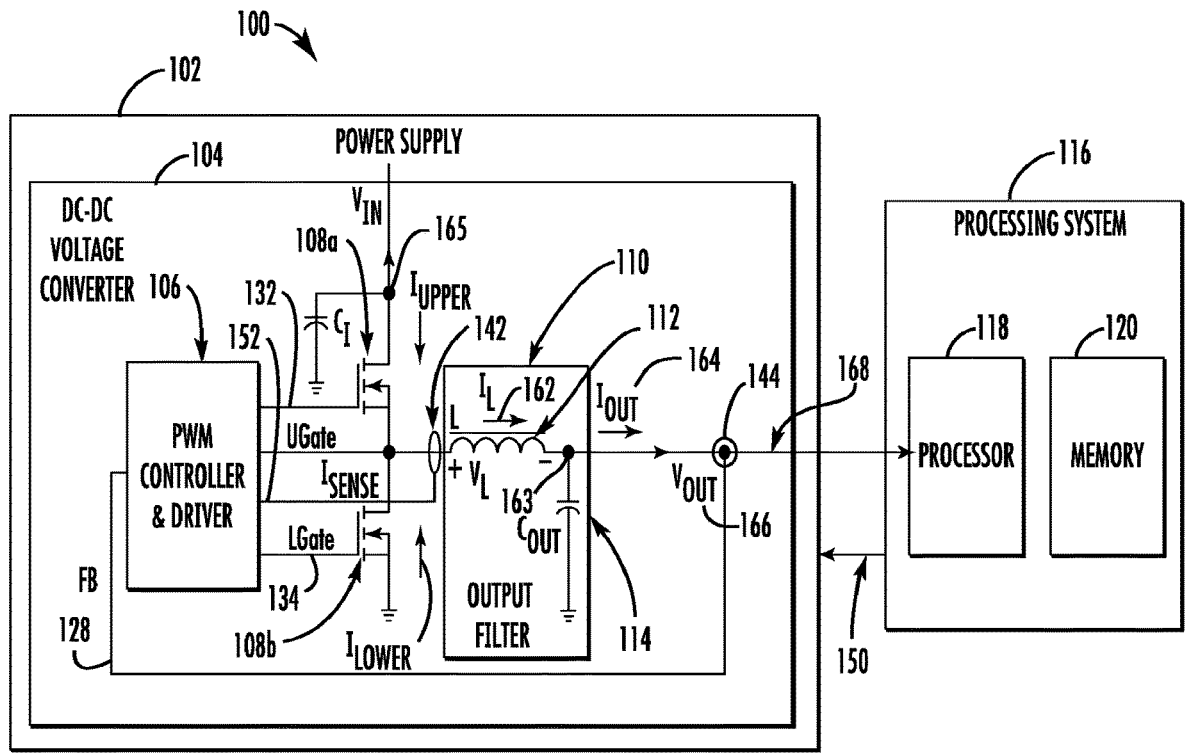
FIG. 1 illustrates an embodiment of an electrical system.

FIG. 1 illustrates an exemplary electrical system 100 comprising a load, e.g. a processing system 116, and power supply 102 that includes a voltage converter, e.g. a DC-DC voltage converter 104. The processor 118 can be electrically coupled to, communicate with, and/or control the voltage converter through a data bus 150. This electrical system 100 may be a device related to telecommunications, automobiles, semiconductor test and manufacturing equipment, consumer electronics, or any type of electronic equipment.

The power supply 102 may be AC to DC power supply, or a DC supply powered by a battery. In one embodiment, the processing system 116 may include a processor 118 and memory 120 which are coupled to one another. In another embodiment, the processor 118 may be one or more microprocessors, microcontrollers, embedded processors, digital signal processors, or a combination of two or more of the foregoing. The memory 120 may be one or more volatile memories and/or non-volatile memories such as static random access memory, dynamic random access memory, read only memory, flash memory, or a combination of two or more of the foregoing. The DC-DC voltage converter 104 provides a voltage to the load, system 116, which may be more precise and efficient than a voltage provided by other voltage sources such as low drop out regulators.

The DC-DC Voltage Converter 104 illustrated in FIG. 1 is one embodiment of a current mode DC-DC voltage converter. Current mode DC-DC voltage converters are widely used because they are easier to implement and utilize than alternatives, such as a voltage mode DC-DC voltage converters. Also, current mode DC-DC voltage converters may have fixed clock frequencies which generate less radio frequency interference than voltage converters having variable clock frequencies.

One embodiment of a current mode DC-DC voltage converter will now be described. The DC-DC voltage converter 104 includes a pulse width modulation ('PWM') controller and driver 106, power transistors, e.g. upper metal oxide semiconductor field effect transistor ('MOSFET') 108a and a lower MOSFET 108b, and an output filter 110. The PWM controller and driver 106 generates UGate control signal 132 and an LGate control signal 134 that are respectively coupled to inputs of the upper MOSFET 108a and the lower MOSFET 108b. In one embodiment, the UGate control signal 132 and the LGate control signal 134 are generated from a PWM signal. The PWM signal, and thus the UGate control signal 132 and an LGate control signal 134 respectively, cause the upper MOSFET 108a and the lower MOSFET 108b to alternatively switch on and off. In one embodiment, the PWM controller and driver 106 may include dead time control. The output filter 110 may include a series inductor 112 and shunt capacitor 114. The DC-DC Voltage Converter 104 has a converter output 168 with a corresponding output voltage 166, $V_{OUT}$, and output current, $I_{OUT}$, 164.

In one embodiment, a current sensor 142 is coupled to a terminal of the inductor 163 of the output filter 110. The current sensor 142 generates an inductor current sense signal 152, $I_{SENSE}$, representative of the inductor current 162, $I_L$. The inductor current sense signal 152 may communicate information about the inductor 112 by varying its voltage or current level.

In another embodiment, a current sensor may be placed proximate to the upper MOSFET 108a to measure the drain to source current of the upper MOSFET 108a. A signal representative of the drain to source current flowing through the upper MOSFET 108a may be used in lieu of the inductor current sense signal 152 in the embodiments described herein.

The current sensor 142 and corresponding inductor current sense signal 152 are coupled to the PWM controller and driver 106. In another embodiment, the inductor current 162 and inductor current sense signal 152 have triangular or saw tooth waveforms. In an alternative embodiment, the inductor current sense signal 152 may be synthesized, e.g. emulated, rather than sensed.

In one embodiment, a voltage sensor 144 is coupled to the converter output 168. The voltage sensor 144 generates an output voltage sense signal 128, FB, representative of the output voltage 166. The output voltage sense signal 128 may communicate information about the output voltage 166 by varying its voltage or current level.

In one embodiment, the upper MOSFET 108a and the lower MOSFET 108b are powered by the power supply 102. In another embodiment, the power supply 102 provides an input voltage 165, $V_{IN}$, which is coupled to the drain of the upper MOSFET 108a. In yet a further embodiment, the input voltage 165 is a direct current ('DC') voltage provided by the power supply 102.

In conventional implementations of current mode DC-DC voltage converters, the PWM controller may transition between peak and valley current control modes when the duty cycle of the PWM signal transitions above or below a fifty percent duty cycle. The change in duty cycle may be due to increasing or decreasing the input voltage 165. The change between peak and valley current control modes eliminates undesirable sub-harmonic oscillations that would occur if just one mode were used. However, the transition causes an undesirable transient in the inductor current, and a deviation of output voltage from the desired level.

The PWM controller and driver 106 is advantageously formed with a PWM signal generator 506 that decreases such transients in the inductor current 162, and deviations in output voltage 166. Embodiments of the PWM signal generator will be subsequently described in more detail with respect to FIGS. 3, 4, 5, and 6.

The PWM signal generator accomplishes the above by monitoring the PWM signal duty cycle. Positive window offset and negative window offset voltages are also generated respectively above and below the voltage of the COMP signal (later described).

When the PWM signal duty cycle is less than fifty percent, the PWM signal generator operates in peak current control mode. When, upon the rising edge of a first clock signal, if a voltage level of a signal representative of the inductor current, $I_{SENSE}$, is less than the positive window offset voltage, the PWM signal transitions from logic low to logic high. When the voltage level of $I_{SENSE}$ becomes greater than the positive window offset voltage, the PWM signal transitions from logic high to logic low.

When the PWM signal duty cycle is greater than fifty percent, the PWM signal generator operates in valley current control mode. When the voltage level of $I_{SENSE}$ is less than the negative window offset voltage, the PWM signal transitions from logic low to logic high. When, upon the rising edge of a second clock signal, the voltage level of $I_{SENSE}$ is greater than negative window offset voltage the PWM signal transitions form logic high to logic low.

Figure 2:
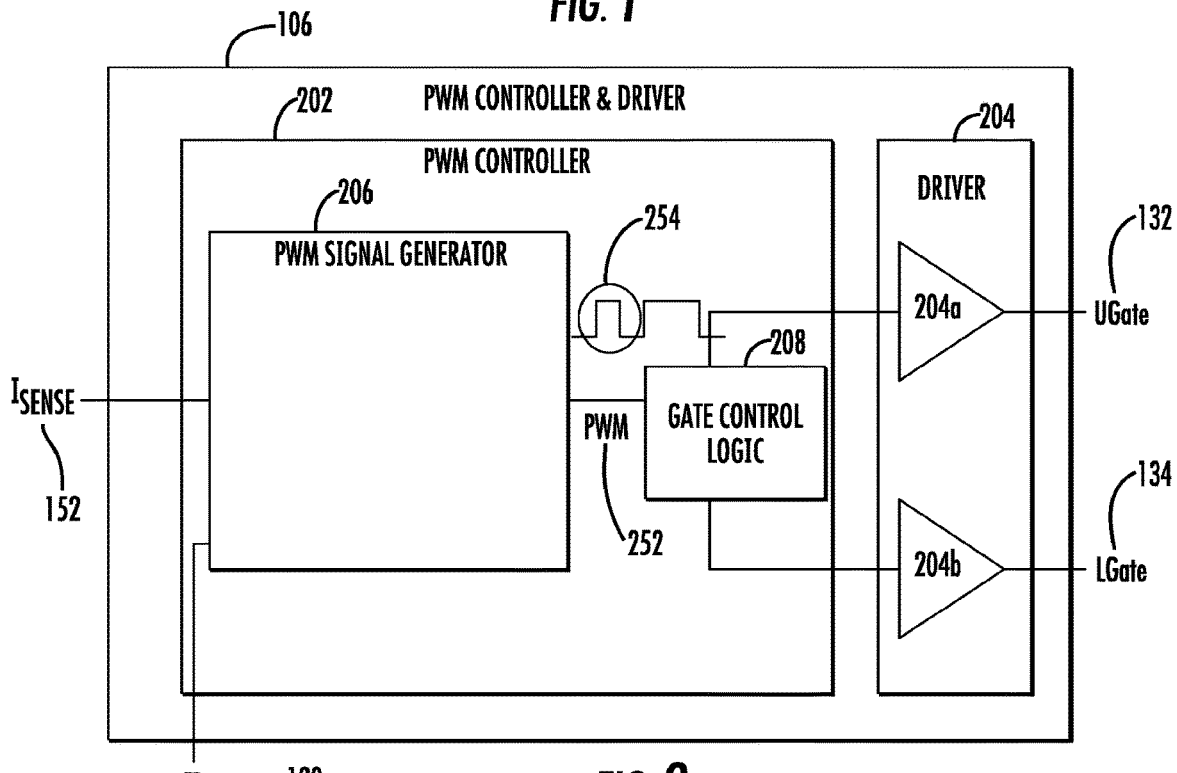
FIG. 2 illustrates an embodiment of a PWM controller and driver.

FIG. 2 illustrates one embodiment of the PWM controller and driver 106 including a PWM controller 202 and a driver 204. In this embodiment, the PWM controller 202 is advantageously formed by Gate control logic 208, and the aforementioned PWM signal generator 206.

The PWM signal generator 206 generates a PWM signal 252, which includes at least one pulse 254. The PWM signal generator 206 is configured to provide the PWM signal 252 at an output of the PWM signal generator 206. In one embodiment, a PWM SR flip flop (later described), in the PWM signal generator 206, is configured to provide the PWM signal 252 at an output of the PWM SR flip flop.

In one embodiment of the PWM signal generator 206, the Gate control logic 208 is configured to receive the PWM signal 252. In a further embodiment, the Driver 204 includes two amplifiers 204a, 204b, e.g. voltage level shifters. Two outputs of the Gate control logic 208 are configured to be coupled to two corresponding inputs of the Driver 204. In one embodiment, each input of the Gate control logic 208 is configured to be coupled to a corresponding amplifier of the Driver 204. The two amplifiers 204a, 204b of Driver 204 have outputs configured to be coupled to two corresponding outputs of the Driver 204. The two outputs of the Driver 204 are configured to provide respectively the UGate control signal 132 and the LGate control signal 134. The inputs of the power transistors, e.g. the gates of each of the upper MOSFET 108a and the lower MOSFET 108b, are configured to receive respectively the UGate control signal 132 and the LGate control signal 134. The output signals generated by the Gate control logic 208 are conditioned by the amplifiers 204a, 204b to control the switching of the upper MOSFET 108a and the lower MOSFET 108b.

In one embodiment, the PWM signal generator 206 is configured to receive the output voltage sense signal 128. In yet a further embodiment, the PWM signal generator 206 is configured to receive the inductor current sense signal 152.

In one embodiment, the PWM controller and driver 106 is fabricated on a single integrated circuit ('IC'). Alternatively, the PWM controller 202 and driver 204 of PWM Controller and Driver 106 may be fabricated on separate ICs. In a further embodiment, the upper MOSFET 108a and the lower MOSFET 108b may be fabricated on a single IC. In yet another embodiment, the upper MOSFET 108a and lower MOSFET 108b may be fabricated on the same IC as the PWM controller and driver 106. In yet a further embodiment, the Gate Control Logic 208 can be fabricated on the same IC as the Driver 204, where the Driver 204 and the remainder of the circuitry of the PWM Controller 202 are fabricated on a separate IC.

Figure 3:
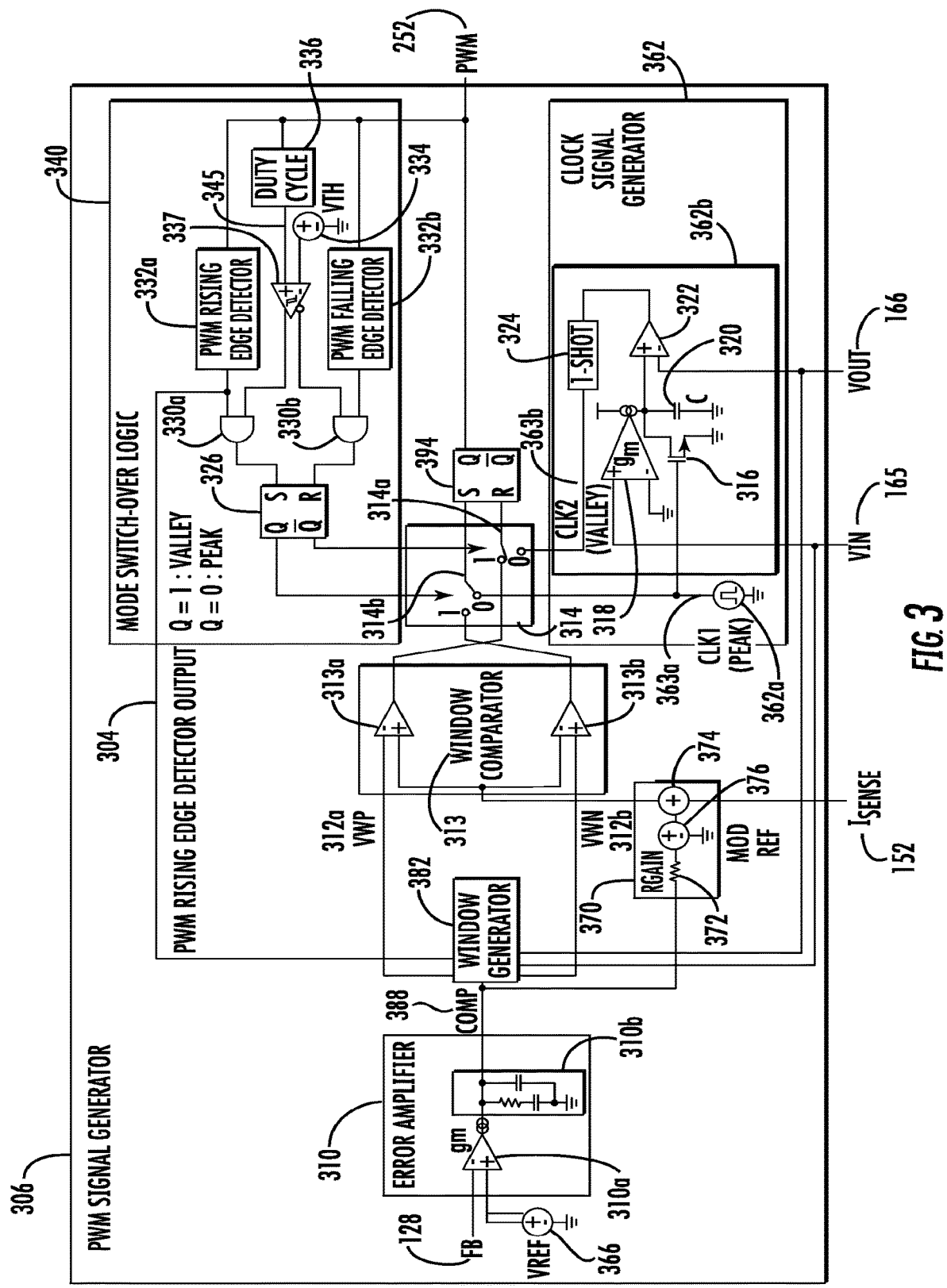
FIG. 3 illustrates an embodiment of a PWM controller.

FIG. 3 illustrates one embodiment of a PWM signal generator 306 that decreases transients in the inductor current 162, and deviations in output voltage 166. The PWM signal generator 306 includes an error amplifier 310, a window generator 382, a window comparator 313, Mode switch-over logic 340, a clock signal generator 362, one or more switches 314, and a PWM SR flip flop 394. In one embodiment, the window comparator 313 includes a first window comparator 313a and a second window comparator 313b. Window generators are further described in U.S. Pat. No. 7,755,341 which is hereby incorporated by reference. In another embodiment, the clock signal generator 362 includes a first clock 362a and a second clock 362b. The error amplifier 310 generates a COMP or error signal 388 which is used by the window generator 382 to generate positive and negative window offset voltages 312a, 312b. The positive and negative window offset voltages 312a, 312b are used in lieu of the COMP signal 388 respectively in peak and valley current control modes. The PWM signal 252 transitions between the peak and valley current control modes when the mode switch-over logic 340 detects a transition in duty cycle to above or below fifty percent.

For a duty below fifty percent, the PWM signal generator 306 operates in peak current control mode. Upon a pulse of the first clock signal, the PWM signal 252 transitions from logic low to logic high. When the voltage of the inductor current sense signal 152, $I_{SENSE}$, exceeds the positive window offset voltage 312a, the PWM signal 252 transitions from logic high to logic low.

For a duty cycle above fifty percent, the PWM signal generator 306 operates in valley current control mode. When the voltage of the inductor current sense signal 152, $I_{SENSE}$, is less than the negative window offset voltage 312b, the PWM signal 252 transitions from logic low to logic high. When a pulse of a second clock signal occurs, the PWM signal 252 transitions to from logic high to logic low.

The error amplifier 310 has positive and negative inputs. In one embodiment, the negative input is configured to receive the output voltage sense signal 128, and the positive input is configured to receive a reference voltage 366.

In the illustrated embodiment, the error amplifier 310 comprises an error amplifier transconductance amplifier 310a, and a compensation network 310b configured to receive the output of the error amplifier transconductance amplifier 310a. The negative input of the error amplifier transconductance amplifier 310a is configured to receive the output voltage sense signal 128. The positive input of the error amplifier transconductance amplifier 310a is configured to receive a reference voltage 366. The error amplifier 310 generates a COMP signal 388. The output of the error amplifier 310 is configured to provide the COMP signal 388. An input of a window generator 382 is configured to receive the COMP signal 388. In one embodiment, other inputs of the window generator 382 are respectively configured to receive $V_{IN}$ 165, $V_{OUT}$ 166, and an output signal 304, PWM rising edge detector output signal, of a PWM rising edge detector 332a.

The window generator 382 generates a positive window offset voltage 312a, VWP, and a negative window offset voltage 312b, VWN. Outputs of the window generator 382 are configured to provide the positive window offset voltage 312a, VWP, and the negative window offset voltage 312b, VWN. In one embodiment, VWP 312a is greater than the voltage of the COMP signal 218; also, VWN 312b is less than the voltage of the COMP signal 218. In another embodiment, the absolute value of the difference between VWP 312a and the voltage of the COMP signal 218 is equivalent to the absolute value of the difference between the voltage of the COMP signal 218 and VWN 312b.

The window generator 382 is coupled to a window comparator 313. The window comparator 313 includes a first window comparator 313a and a second window comparator 313b. In one embodiment, the window comparator 313 is configured to receive the positive output window voltage VWP 321a, the negative output window voltage VWN 321b, and the inductor current sense signal 152, $I_{SENSE}$. In another embodiment, the window comparator 313 is configured to receive a synthesized representation of the inductor current in lieu of the inductor current sense signal 152, $I_{SENSE}$.

In another embodiment, a modulator reference voltage 376 is coupled to the output of the error amplifier 310 and the output of the current sensor 142 (i.e. coupled to the inductor current sense signal 152, $I_{SENSE}$). As a result, both the inductor current sense signal 152 and COMP signal 388 are centered about the modulator reference voltage 376, MOD REF. This enhances the performance, including the stability, of the PWM signal generator 306. In one embodiment, the modulator reference voltage 376 is selected by the designer of the power supply 102. In one embodiment, this is facilitated by a reference voltage adjustment circuit 370. The reference voltage adjustment circuit 370 is coupled to both the COMP signal 388 and the inductor current sense signal 152 as illustrated in FIG. 3. In a further embodiment, to center the COMP signal 388 on the modulator reference voltage 376, the reference voltage adjustment circuit 370 includes a resistor $R_{GAIN}$ 372 coupled between the COMP signal 388 and the modulator reference voltage 376. To center the inductor current sense signal 152 about the modulator reference voltage 376, the modulator reference voltage 376 is added by summer 374 to the modulator reference voltage 376. The summed voltages are then coupled to the input of the window comparator 313 in lieu of the inductor current sense signal 152. Although not shown in the circuit subsequently described FIG. 5, the foregoing technique may also be used in an embodiment of that circuit. Additional description is found in the following all of which are hereby incorporated by reference: U.S. Pat. No. 8,154,268; Richard Redl and N. O. Sokal, "Current-Mode Control, Five Different Types, Used with the Three Basic Classes of Power Converters: Small-Signal AC and Large-Signal DC Characterization, Stability Requirements, and Implementation of Practical Circuits," Proc. IEEE PESC 1985 Conference, 1985, PP. 771-785; and X. Duan and A. Q. Huang, "Current-Mode Variable-Frequency Control Architecture for High-Current Low-Voltage DC-DC Converters," IEEE Transactions on Power Electronics, Vol. 21, No. 4, July 2006.

In the illustrated embodiment, a negative input of a first window comparator 313a is configured to receive the positive offset window voltage VWP 312a. The positive input of a second window comparator 313b is configured to receive the negative output window voltage VWN 312b. In one embodiment, the positive input of the first window comparator 313a and the negative input of the second window comparator 313b are configured to receive the inductor current sense signal 152, $I_{SENSE}$. In another embodiment, the positive input of the first widow comparator 313a and the negative input of the second window comparator 313b are configured to receive a synthesized representation of the inductor current.

When the voltage of the inductor current sense signal 152 is greater than the positive window offset voltage 312a, the first window comparator 313a generates a logic high output. When the voltage of the inductor current sense signal 152 is less than the positive window offset voltage 312a, the first window comparator 313a generates a logic low output. When the voltage of the inductor current sense signal 152 is less than the negative window offset voltage 312b, the second window comparator 313b generates a logic high output.

The output of the window comparator 313 is coupled to a switch 314 which, e.g. may be comprised of first and second single pole double throw (SPDT) switches 314a, 314b. In one embodiment, the switch 314 may be a double pole double throw (DPDT) switch in lieu of the first and second SPDT switches 314a, 314b. The invention will be further described with the switch 314 including the first and second SPDT switches 314a, 314b.

A first terminal of a first single pole double throw (SPDT) switch 314a is configured to receive the logic output from the first window comparator 313a. A first terminal of a second SPDT switch 314b is configured to receive the logic output from the second window comparator 312b.

The second terminal of the second SPDT switch 314b is configured to receive a first clock signal 363a, CLK1, from a first clock 362a. The second terminal of the first SPDT switch 314a is configured to receive a second clock signal 363b, CLK2, from a second clock 362b.

The common terminal of the first SPDT switch 314a is coupled to the Reset input of the PWM SR flip flop 394. Depending upon the position of the first SPDT switch 314a, the Reset input of the PWM SR flip flop 394 is configured to receive either the second clock signal 363b or the logic output from the first window comparator 313a.

The common terminal of the second SPDT switch 314b is coupled to the Set input of the PWM SR flip flop 394. The Set input of the PWM SR flip flop 394 is configured to receive either the first clock signal 363a or the logic output from the second window comparator 313b.

The first SPDT switch 314a and the second SPDT switch 314b are controlled by a Mode switch-over logic circuit 340, and are respectively configured to receive control signals from the output and complementary output of the Mode switch-over logic circuit 340. One embodiment of the Mode switch-over logic circuit 340 is illustrated in FIG. 3.

The Mode switch-over logic circuit 340 includes a duty cycle detector 336, PWM rising edge detector 332a, and a PWM falling edge detector 332b. The Mode switch-over logic circuit 340 also includes a first AND gate 330a, a second AND gate 330b, a hysteretic comparator 337, and a mode logic SR flip flop 326.

When a rising edge of a pulse 254 of the PWM signal 252 is detected, and the duty cycle of the PWM signal 252 is determined to be greater than fifty percent, the Mode switch-over logic 340 directs the PWM signal generator 306 to operate in valley current control mode. When a falling edge of a pulse 254 of the PWM signal 252 is detected, and the duty cycle of the PWM signal 252 is determined to be less than fifty percent, the Mode switch-over logic 340 directs the PWM signal generator 306 to operate in peak current control mode.

An input of each of the duty cycle detector 336, the PWM rising edge detector 332*a*, and PWM falling edge detector 332*b* are configured to receive the PWM signal 252. The outputs of PWM rising edge detector 332*a* and the PWM falling edge detector 332*b* are configured to provide a logic high respectively when a rising and falling edge of the PWM signal 252 are detected. An output of each of the PWM rising edge detector 332*a* and the PWM falling edge detector 332*b* are configured to provide a logic low when respectively a rising and falling edge of the PWM signal 252 are not detected. In one embodiment, the outputs of the PWM rising edge detector 332*a* and the PWM falling edge detector 332*b* are digital waveforms.

In one embodiment, the duty cycle detector 336 generates a duty cycle signal 345 that is representative of the duty cycle of the PWM signal 252, e.g. having a voltage or current level varying proportionally with the duty cycle. The output of the duty cycle detector 336 is configured to provide the duty cycle signal 345.

In one embodiment, the positive input of the hysteretic comparator 337 is configured to receive the duty cycle signal 345. A threshold reference voltage 334 is coupled to the negative input of the hysteretic converter 337. The threshold reference voltage 334 may be generated in the PWM signal generator 306, or provided by an external source. The hysteretic comparator 336 is used to facilitate transitioning the PWM signal generator 306 between peak and valley current control modes without chattering between the two modes.

The hysteretic comparator 337 has complementary and non-complementary outputs. The non-complementary output and complementary output of hysteretic comparator 337 are respectively configured to provide a logic high and a logic low when the duty cycle of the PWM signal 252 exceeds fifty percent. The non-complementary output and complementary output of hysteretic comparator 337 are respectively configured provide a logic low and a logic high when the duty cycle of the PWM signal 252 is less than fifty percent. A second input of the first AND gate 330*a* are configured to receive the non-complementary logic output signal. A second input of the second AND gate 330*b* is configured to receive the complementary logic output signal. Second inputs of the first AND gate 330*a* and the second AND gate 330*b* are configured to receive respectively the output signals of the PWM rising edge detector 332*a* and the PWM falling edge detector 332*b*.

In one embodiment, a Set input of the mode logic SR flip flop 326 is configured to receive the output logic signal of the first AND gate 330*a*. A Reset input of the mode logic SR flip flop 326 is configured to receive the output logic signal of the second AND gate 330*b*.

The logic output signals of the first AND gate 330*a* and the second AND gate 330*b* are respectively high and low when the duty cycle of the PWM signal 252 is greater than fifty percent, and a rising edge of a pulse 254 of the PWM signal 252 is detected. As a result the logic signals of the non-complementary and complementary outputs of the mode logic SR flip flop 326 transition respectively high and low initiating valley current control mode operation.

The logic output signals of the first AND gate 330*a* and the second AND gate 330*b* are respectively low and high when the duty cycle of the PWM signal 252 is less than fifty percent, and a falling edge of a pulse of the PWM signal 252 is detected. As a result the logic signals of the non-complementary and complementary outputs of the mode logic SR flip flop 326 transition respectively low and high initiating peak current control mode operation.

In one embodiment, a control input of the second SPDT switch 314*b* is configured to receive the non-complementary logic output signal of the mode logic SR flip flop 326; the non-complementary logic output signal controls the second SPDT switch 314*b* setting, i.e. either first or second terminal. A control input of the first SPDT switch 314*a* is configured to receive the complementary logic output signal, of the mode logic SR flip flop 326 is coupled to the first SPDT switch 314*a*, and controls the first SPDT switch 314*a* setting, i.e. either first or second terminal.

In peak current control mode operation, the non-complementary output, and complementary output, logic signals of the mode logic SR flip flop 326 are respectively logic low and high. In this case, the inputs of first SPDT switch 314*a* and second SPDT switch 314*b* are configured to respectively receive the output signal of the first window comparator 313*a* and the first clock 362*a*. When the output logic signal of the first window comparator 313*a* and the first clock signal 363*a* are respectively logic low and logic high, the PWM signal 252 transitions from logic low to logic high. That is upon a pulse of the first clock signal 363*a*, the PWM signal 252 transitions to logic high. When the output signal of the first window comparator 313*a* and the first clock 362*a* are respectively logic high and logic low, the PWM signal 252 transitions form logic high to logic low. That is upon a pulse of the first clock signal 363*a*, the PWM signal 252 transitions to logic low.

In valley current control mode operation, the non-complementary output and complementary output logic signals are respectively logic high and logic low. In this case, the inputs of first SPDT switch 314*a* and second SPDT switch 314*b* are respectively configured to receive the output signal of the second clock 362*b* and the second window comparator 313*b*. When the output signal of the second window comparator 313*b* and the second clock 362*b* are respectively logic low and logic high, the PWM signal 252 transitions from logic high to logic low. That is when a pulse of the second clock signal occurs, the PWM signal 252 transitions to logic low. When the output of the second window comparator 313*b* and the second clock 362*a* are respectively logic high and logic low, the PWM signal 252 transitions form logic low to logic high. That is when a pulse of the second clock signal 363*b* occurs, the PWM signal 252 transitions to logic high.

The first clock 362*a* may be implemented in one of numerous embodiments well known to those skilled in the art. One embodiment of the second clock 362*b* is illustrated in FIG. 3 and described below.

A transistor 316, e.g. a MOSFET, has its input, e.g. the gate, configured to receive the output signal of the first clock 362A. A first output terminal of the transistor 316, e.g. the source, is configured to be coupled to a voltage, s e.g. ground. A second output terminal of the transistor 316, e.g. the drain, is configured to be coupled to a first terminal of a capacitor 320. A second terminal of the capacitor 320 is configured to be coupled to the voltage, e.g. ground.

The second output terminal of transistor 316 is configured to be coupled to the output of a clock transconductance amplifier 318. The negative input of the clock transconductance amplifier 318 is configured to be coupled to a voltage, e.g. ground. The positive input of the clock transconductance amplifier 318 is configured to be coupled to the input voltage 165.

The positive input of a clock comparator 322 is configured to be coupled to the output of the clock transconductance amplifier 318. The negative input of the clock comparator 322 is configured to be coupled to the output voltage 166. The clock comparator 322 output is coupled to the input of a monostable multivibrator or one-shot circuit 324. The output of the one-shot circuit 324 provides the second clock signal 363b which is the output signal of the second clock 362b.

The operation of the foregoing embodiment of the second clock 362b will now be described. When a pulse of the first clock signal 363a occurs, the transistor 316 is turned on, providing a discharge path for charge stored in the capacitor 320; thus, capacitor 320 discharges rapidly. After the typically narrow pulse ends, the transistor turns off, and the discharge path is eliminated. Then, the clock transconductance amplifier 318 begins recharging the capacitor 320; the voltage across the capacitor 320 linearly increases. Over time, the voltage across the capacitor 320 has a saw tooth waveform.

When the capacitor 320 charges so that the voltage across the capacitor 320 exceeds the output voltage 166, the output of the clock comparator 322, coupled to the input of the one-shot circuit 324, becomes logic high, and provided to the input of the one-shot circuit 324. Having a logic high input, the one-shot circuit 324 then generates the pulse of the second clock signal 363b; the pulse length of the second clock signal 363b is determined by the design of the one-shot circuit 324. The period of the second clock signal 363b is equal to the period of the first clock signal 363a. The time delay, delta t, between the initiation of a pulse of the first clock signal 363a and the initiation of a pulse of the second clock signal 363b is determined pursuant to the following equation:

$$\text{delta } t = \frac{C}{gm}\left[\frac{V_{OUT}}{V_{IN}}\right],$$

where gm is the transconductance of the clock transconductance amplifier 318, and C is the capacitance of the capacitor 320.

$$\frac{C}{gm}$$

may be chosen to be approximately equal with $T_s$, the switching period, set by the first clock signal 362a. Under these conditions delta t approximates the ON-time of the high side switch 108a of the DC-DC converter.

Figure 4:
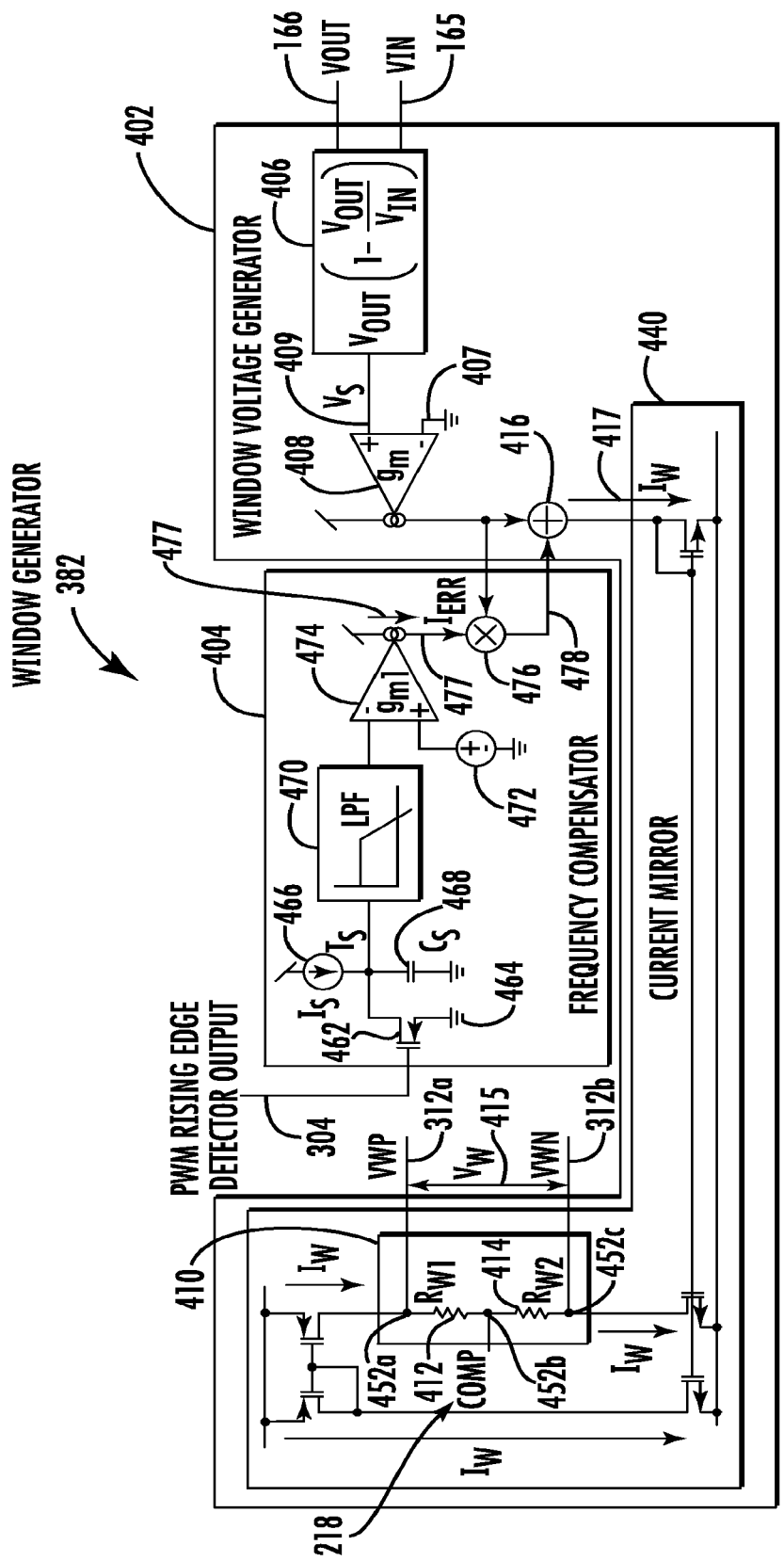
FIG. 4 illustrates an embodiment of a window generator.

FIG. 4 illustrates one embodiment of the window generator 382. The window generator 382 includes a window voltage generator 402 configured to be coupled to a frequency compensator 404.

In one embodiment, the window voltage generator 402 includes a voltage scaler 406 having inputs configured to be coupled to the input voltage 165 and the output voltage 166. In one embodiment the voltage scaler generates a scaled voltage 409, $V_S$, determined by the following transfer function:

$$V_S = V_{OUT}\left\{1 - \frac{V_{OUT}}{V_{IN}}\right\}$$

In another embodiment, the voltage scaler 406 is implemented with analog circuitry such as a translinear circuit or a Gilbert cell.

The positive input of a window transconductance amplifier 408 is configured to be coupled to the output of the voltage scaler 406. The negative input of the window transconductance amplifier 408 is configured to be coupled to a voltage, e.g. ground. The output of the window transconductance amplifier 408 generates a window current 417, $I_W$, which is proportional to the scaled voltage 409. The output of the window transconductance amplifier 408 is configured to be coupled to a current mirror 440. In one embodiment, the output of the window transconductance amplifier 408 is coupled a first input of a summer 416, e.g. when the frequency compensator 404 is included in the window generator 382. The output of the summer 416 is configured to be coupled to a current mirror 440.

The window voltage generator 402 also includes the current mirror 440. The current mirror 440 mirrors the window current 417, $I_W$. The current mirror 440 includes a resistor network 410. The resistor network 410 is formed by a first resistor 412, $R_{W1}$, and a second resistor 414, $R_{W2}$. The resistor network 410 has a first terminal 452a, a second terminal 452b, and a third terminal 452c. The positive window offset voltage 312a and the negative window offset voltage 312b are respectively provided at the first terminal 452a and third terminal 452c. The COMP signal 218 is provided to the second terminal 452b.

As a result, the absolute voltage differences between respectively the positive window offset voltage 312a and the negative window offset voltage 312b, and the COMP signal 218 voltage are equal (assuming that resistors 412 and 414 have equal value). The difference between the positive window offset voltage 312a and the negative window offset voltage 312b is the window voltage 415, $V_W$.

The frequency compensator 404 includes a compensator transistor 462 having one input terminal and two output terminals. The input terminal is configured to be coupled to the PWM rising edge detector output signal 304 which in one embodiment is provided by the Mode switch-over logic 340. A first output terminal is configured to be coupled to a voltage 464, e.g. ground. The second output terminal is configured to be coupled to the output of a current source 466 and a first terminal of a capacitor 468. The second terminal of the capacitor 468 is configured to be coupled to a voltage, e.g. ground. An input of a low pass filter 470 is configured to be coupled to the second output terminal of transistor 462. A negative input of a compensator transconductance amplifier 474 is configured to be coupled to an output of the low pass filter 470. A positive input of the compensator transconductance amplifier 474 is configured to be coupled to a reference voltage 472; the reference voltage 472 can be generated internally or externally to the PWM Controller 302. A first input of a multiplier 476 is configured to be coupled to an output of the compensator transconductance amplifier 474. A second input of the multiplier 416 is configured to be coupled to the output of the window transconductance amplifier 408. A second input of the summer 416 is configured to be coupled to the output of the multiplier 476.

If the output of the PWM rising edge detector 332a is a pulse train, the voltage across the capacitor 468 is in the form of a saw tooth waveform as described above. This saw tooth voltage waveform is provided to the input of the low pass filter 470. The output of the low pass filter 470 provides a DC output signal that is the average of the saw tooth signal, and whose voltage is representative of a switching period $T_S$. The output of the low pass filter 470 is coupled to the negative input of the compensator transconductance amplifier 474. A reference voltage 472, representative of a predetermined $T_S$ target voltage, is coupled to the positive input of the compensator transconductance amplifier 474. The compensator transconductance amplifier 474 compares the voltage of the low pass filter's 470 output signal against the reference voltage 472, and generates an error current 477, $I_{ERR}$. The error current 477 is multiplied by the window current 417 by the multiplier 476, and the resulting product 478, e.g. in the form of a varying current level, is produced by the multiplier 476. Then, the product 478 is added to the window current 417 by the summer 416.

Figure 5:
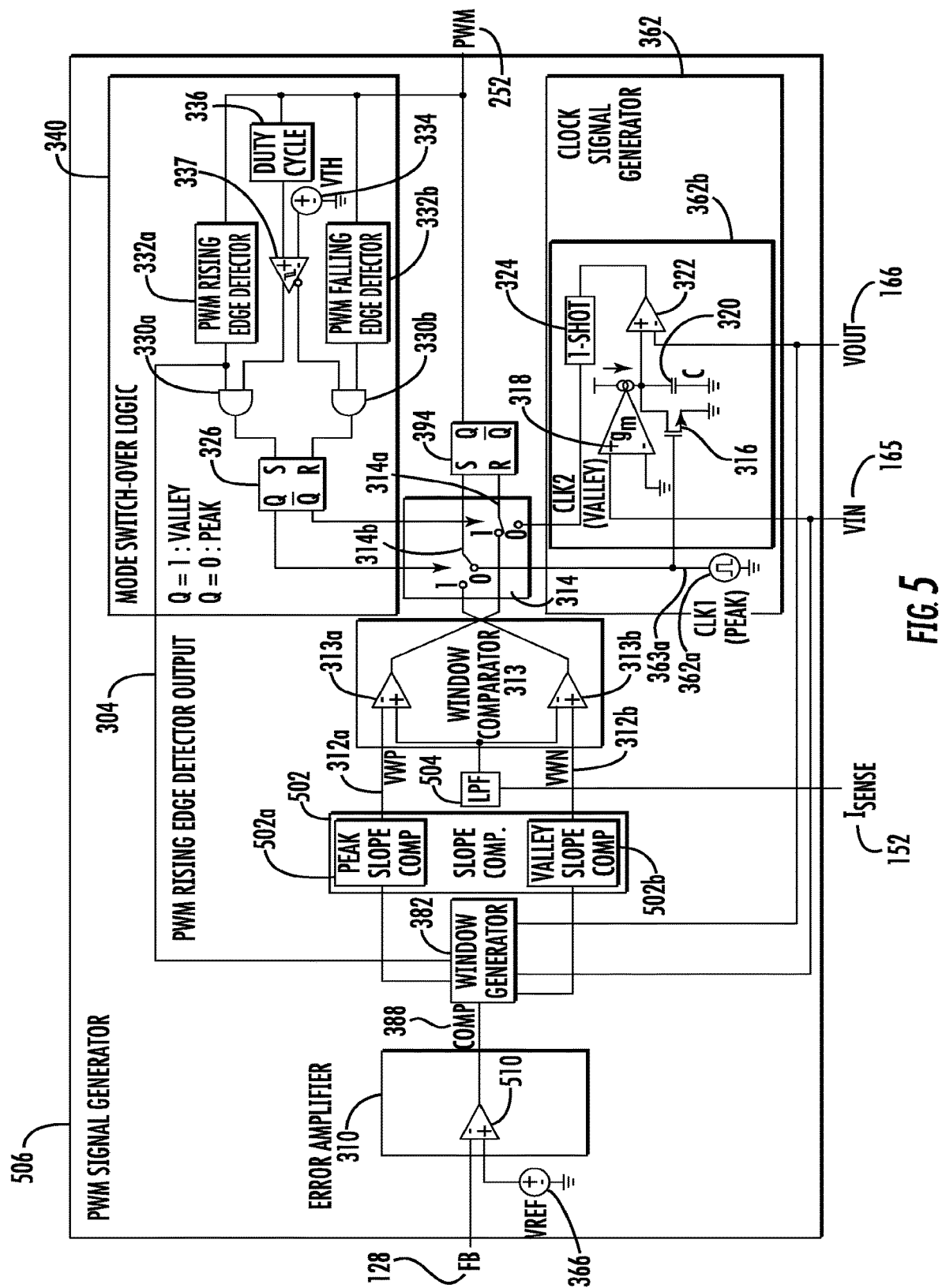
FIG. 5 illustrates another embodiment of a PWM controller.

FIG. 5 illustrates another embodiment of a PWM Controller. In this embodiment, the PWM signal generator 506 includes a slope compensator 502 that enhances the stability of the DC-DC voltage converter 104. The slope compensator 502 has at least one input configured to be coupled to an output of the window generator 382, and at least one output configured to be coupled to an input of the window comparator 313. In one embodiment, the slope compensator 502 includes slope compensation offset correction. Slope compensation offset correction is described in U.S. Pat. No. 9,024,610 which is hereby incorporated by reference.

In one embodiment, the slope compensator 502 includes a peak slope compensator 502a and a valley slope compensator 502b. The peak slope compensator 502a has an input configured to be coupled to an output of the window generator 382, and an output configured to be coupled to an input of the first window comparator 313a. The valley slope compensator 502b has an input configured to be coupled to an output of the window generator 382, and an output configured to be coupled to an input of the second window comparator 313b. In another embodiment each of the peak slope compensator 502a and the valley slope compensator 502b include slope compensation offset correction.

In another embodiment, as illustrated in FIG. 5, the stability and transient performance of the PWM signal generator 506 is enhanced by filtering the inductor current sense signal 152 with a low pass filter 504, while eliminating the compensation circuit 310b in the error amplifier 310, and replacing the error amplifier transconductance amplifier 310a with a error amplifier voltage amplifier 510. This technique also can reduce the implementation cost of the PWM signal generator 506.

Figure 6:
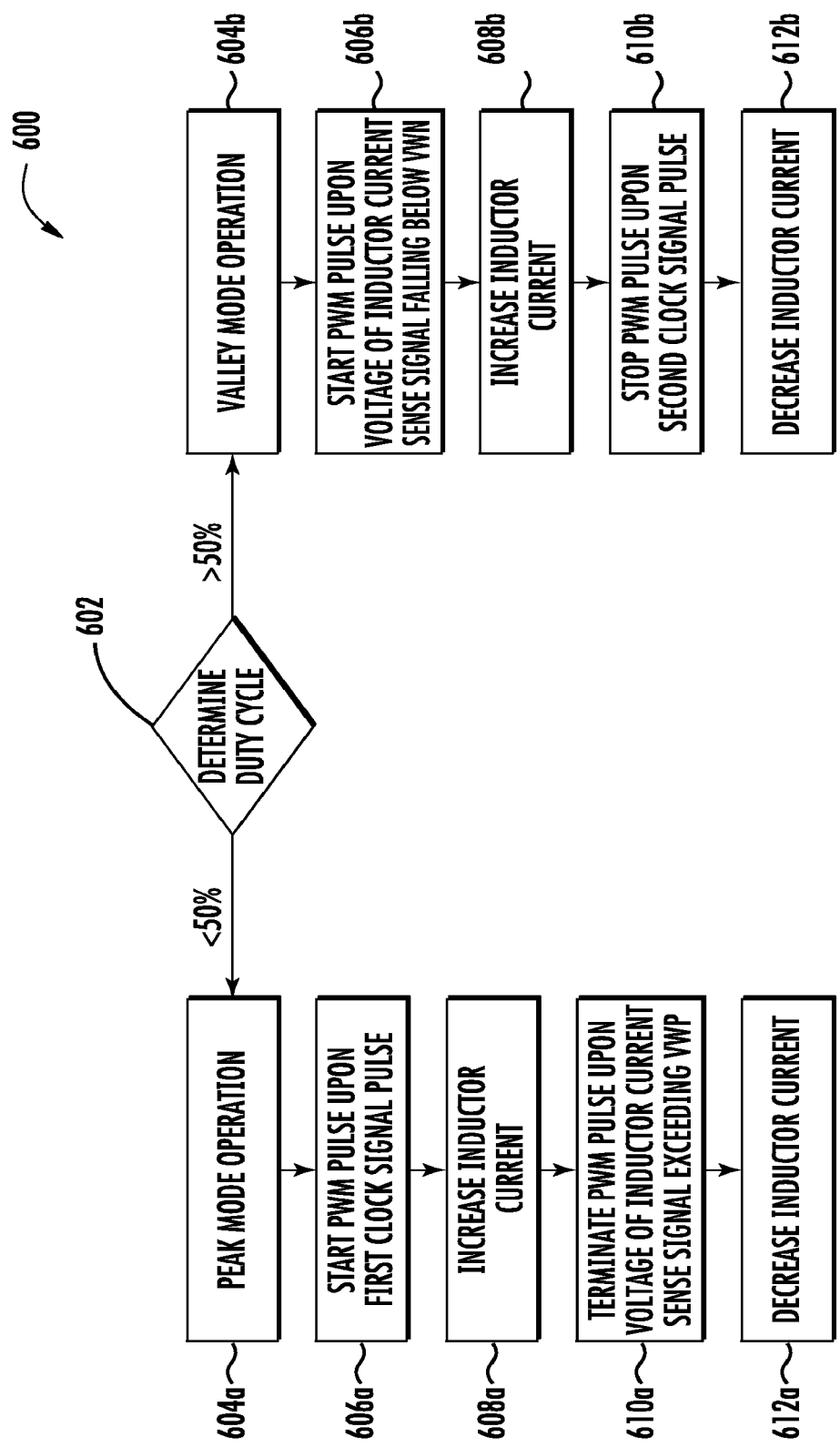
FIG. 6 illustrates one embodiment of operation of a PWM Controller.

One embodiment of a method of operation 600 of a current mode DC-DC converter 104 including the PWM signal generator 306 will now be described, as further illustrated in FIG. 6. In block 602, the duty cycle of the PWM signal 252 is determined, e.g. by the duty cycle detector 336. In block 604a, if the duty cycle of the PWM signal 252 is less than fifty percent, the PWM controller 302 operates in peak current mode. In one embodiment, when the duty cycle is less than fifty percent, then the output of the duty cycle detector 336 is logic high. In an alternative embodiment, when the duty cycle is greater than fifty percent, then the output of the duty cycle detector 336 is logic low.

The following blocks are described for peak current control mode operation. In block 606a, upon the occurrence of a pulse of the first clock signal, the PWM SR flip flop 394 transitions its non-complementary output to a high logic state, initiating a pulse 254 of the PWM signal 252. In one embodiment, as a result of such a transition, a power transistor would be turned on.

In block 608a, the inductor current 162 increases, e.g. linearly. Correspondingly, the inductor current sense signal 152 also increases, e.g. linearly. In block 610a, when the voltage of the inductor current sense signal 152 is greater than positive window offset voltage 312a, VWP, the PWM SR flip flop 224 transitions its non-complementary output to a low logic state, terminating the pulse 254 of the PWM signal 252. In one embodiment, as a result of such a transition, a power transistor would be turned off.

In block 612a, the inductor current 162 decreases, e.g. linearly. Correspondingly, the inductor current sense signal 152 also increases, e.g. linearly.

Alternatively, if the duty cycle is determined to be greater than fifty percent in block 604b, the PWM signal generator 306 operates in valley current control mode. The following blocks are described for valley current control mode operation. In block 606b, when the voltage of the inductor current sense signal 152 is less than negative window offset voltage 312b, the PWM SR flip flop 224 transitions its non-complementary output to a high logic state, initiating a pulse 254 of the PWM signal 252. In one embodiment, as a result of such a transition, a power transistor would be turned on.

In the block 608b, the inductor current 162 increases, e.g. linearly. Correspondingly, the inductor current sense signal 152 also increases, e.g. linearly. In block 610a, upon the occurrence of a second clock signal pulse 502, the PWM SR flip flop 224 transitions its non-complementary output 221 to a low logic state, terminating the pulse 254 of the PWM signal 252. In one embodiment, as a result of such a transition, a power transistor would be turned on.

In block 612a, the inductor current 162 decreases, e.g. linearly. Correspondingly, the inductor current sense signal 152 also decreases, e.g. linearly.

Although only a DC-DC buck converter, the invention may be implemented in other DC-DC converter topologies, including without limitation boost converters and buck-boost converters.

It will be evident to one of ordinary skill in the art that the processes and resulting apparatus previously described can be modified to form various apparatuses having different circuit implementations and methods of operation. Notwithstanding that the numerical ranges and parameters setting forth the broad scope of the present teachings are approximations, the numerical values set forth in the specific examples are reported as precisely as possible. Signal levels and generators herein are exemplified with reference to voltage or current. However, those skilled in the art understand that a voltage signal or a voltage generator can respectively be implemented with current signals and current generators, or vice versa. Therefore, such signals may also be referred herein as signals or thresholds rather than voltages and currents. Correspondingly, voltage and current generators may be referred to as generators.

Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the scope of the appended claims. In addition, while a particular feature of the present disclosure may have been described with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. As used herein, the term "one or more of" with respect to a listing of items such as, for example, A and B or A and/or B, means A alone, B alone, or A and B. The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material.

The terms "about" or "substantially" indicate that the value or parameter specified may be somewhat altered, as long as the alteration does not result in nonconformance of the process or structure to the illustrated embodiment. Finally, "exemplary" indicates the description is used as an example, rather than implying that it is an ideal. Other embodiments of the present teachings will be apparent to those skilled in the art from consideration of the specification and practice of the methods and structures disclosed herein. It is intended that the specification and examples be considered as exemplary only, with a true scope and spirit of the present teachings being indicated by the following claims.

Example Embodiments

Example 1 includes an apparatus, comprising: an error amplifier having an output; a window generator coupled to the output of the error amplifier; a window comparator having an input coupled to at least one of an inductor current sense signal and a modified inductor current sense signal, and at least one input respectively coupled to at least one output of the window generator; one or more switches having a first common terminal, a second common terminal, a first terminal, an alternative first terminal, a second terminal coupled to a first output of the window comparator, and an alternative second terminal coupled to a second output of the window comparator; a clock signal generator coupled to the first terminal and alternative first terminal; a flip flop having first input coupled to the first common terminal, a second input coupled to the second common terminal, and an output configured to provide a PWM signal; and mode switch-over logic configured to control the terminal settings of such one or more switches, and configured to receive the PWM signal.

Example 2 includes the apparatus of Example 1, further comprising a reference voltage adjustment circuit configured to receive the inductor current sense signal, configured to provide the modified inductor current sense signal, and coupled to the output of the error amplifier.

Example 3 includes the apparatus of Example 1, further comprising a slope compensator having at least one input configured to receive at least one output of the window generator, at least one output configured to be coupled to at least one input to the window comparator.

Example 4 includes the apparatus of Example 1, wherein the window comparator includes a first window comparator and a second window comparator.

Example 5 includes the apparatus of Example 1, wherein the clock signal generator includes a first clock and a second clock.

Example 6 includes the apparatus of Example 1, wherein the mode switch-over logic further comprises a PWM rising edge detector having an input and an output; wherein the input of the PWM rising edge detector is configured to receive the PWM signal; and wherein the output of the PWM rising edge detector is coupled to the window generator.

Example 7 includes the apparatus of Example 6, wherein the window generator comprises a window voltage generator; and a frequency compensator configured to receive an output of the PWM rising edge detector, and coupled to the window voltage generator.

Example 8 includes the Example 7, wherein the window voltage generator is configured to receive an input voltage, an output voltage, and an output of the frequency compensator.

Example 9 includes the apparatus of Example 8, wherein the window voltage generator comprises: a voltage scaler configured to receive the input voltage and the output voltage; a window transconductance amplifier configured to receive an output of the voltage scaler; and a current mirror coupled to the window transconductance amplifier.

Example 10 includes the apparatus of Example 9, wherein an output voltage of the voltage scaler is equal to $$V_{OUT}\left\{1 - \frac{V_{OUT}}{V_{IN}}\right\};$$

and wherein $V_{OUT}$ is the output voltage, and $V_{IN}$ is the input voltage.

Example 11 includes the apparatus of Example 6, wherein the mode switch-over logic further comprises: PWM falling edge detector having an input and an output; wherein the input of the PWM falling edge detector configured to receive the PWM signal; a duty cycle detector having an input and an output; wherein the input of the duty cycle detector configured to receive the PWM signal; a comparator having a first input, a second input, an output, and a complementary output; wherein the first input of the comparator is coupled to the output of the duty cycle detector; a threshold reference voltage; wherein the threshold reference voltage is coupled to the second input of the comparator; a first AND gate having a first input, a second input, and an output; wherein the first input of the first AND gate is coupled to the output of the comparator; wherein the second input of the first AND gate is coupled to the output of the PWM rising edge detector; a second AND gate having a first input, a second input, and an output; wherein the first input of the second AND gate is coupled to the complementary output of the comparator; wherein the second input of the second AND gate is coupled to the PWM falling edge detector; a mode switch-over logic flip flop having a first input, a second input, a first output, and a second output; wherein the output of the first AND gate is coupled to the first input of the mode switch-over logic flip flop; wherein the output of the second AND gate is coupled to the second input of the mode switch-over logic flip flop; wherein the first output of the mode switch-over logic flip flop is coupled to the first common terminal; and wherein the second output of the mode switch-over logic flip flop is coupled to the second common terminal.

Example 12 includes the apparatus of Example 1, wherein the error amplifier includes an input configured to be coupled to a voltage representative of an output voltage.

Example 13 includes the apparatus of Example 1, wherein the window generator is configured to be coupled to an input voltage, and an output voltage.

Example 14 includes the apparatus of Example 1, wherein the window comparator has a second input configured to be coupled to a signal representative of one of an inductor current or a current flowing through a power transistor.

Example 15 includes the apparatus of Example 1, further comprising: gate control logic configured to receive the PWM signal; and a driver coupled the gate control logic.

Example 16 includes the apparatus of Example 15, further comprising coupling at least one power transistor to the output of the driver.

Example 17 includes the apparatus of Example 16, further comprising an output filter coupled to the at least one power transistor.

Example 18 includes the apparatus of Example 17, further comprising a load coupled to the filter.

Example 19 includes the apparatus of Example 18, wherein the load comprises a processor coupled to a memory.

Example 20 includes a method, comprising: determining a duty cycle of a PWM signal; operating in a valley current control mode when the duty cycle is greater than fifty percent; operating in a peak current control mode when the duty cycle is less than fifty percent, including: commencing a PWM pulse upon an occurrence of a pulse of a first clock signal pulse; and terminating the PWM pulse upon a level of a signal exceeding a positive window threshold.

Example 21 includes the method of Example 20, further comprising: increasing inductor current when the PWM pulse commences; decreasing the inductor current when the PWM pulse terminates; and wherein the signal is one of an inductor current sense signal representative of the inductor current, or a signal emulating the inductor current sense signal, or a signal representative of a current flowing through a power transistor.

Example 22 includes the method of Example 21, wherein the inductor current respectively increases and decreases linearly.

Example 23 includes the method of Example 21, wherein the commencing and terminating of the PWM pulse respectively turns on and off one of one power transistor or two power transistors.

Example 24 includes a method, comprising: determining the duty cycle of a PWM signal; operating in a peak current control mode when the duty cycle is less than fifty percent; operating in a valley current control mode when the duty cycle is greater than fifty percent, including: commencing a PWM pulse upon a level of a signal being less than a negative window threshold; and terminating the PWM pulse upon the occurrence of a pulse of a second clock signal.

Example 25 includes the method of Example 24, further comprising the step of generating the pulse of the second clock signal after a fixed period of time after the occurrence of a pulse of a first clock signal.

Example 26 includes the method of Example 24, further comprising: increasing an inductor current when the PWM pulse commences; and decreasing the inductor current when the PWM pulse terminates; wherein the negative window threshold is a negative window offset voltage; and wherein the signal is one of an inductor current sense signal representative of the inductor current, or a signal emulating the inductor current, or a signal representative of a current flowing through a power transistor.

Example 27 includes the method of Example 25, wherein the inductor current respectively increases and decreases linearly.

Example 28 includes the method of Example 25, wherein the commencing and terminating of the PWM pulse respectively turns on and off one of one power transistor or two power transistors.

What is claimed is:
1. A voltage converter, comprising:
a window comparator;
an inductor current sense signal coupled to a first input of the window comparator;
a window generator including a positive window voltage node coupled to a second input of the window comparator, and a negative window voltage node coupled to a third input of the window comparator;
one or more switches having a plurality of terminals, including at least one terminal coupled to an output of the window comparator;
a PWM signal generator coupled to at least one of the terminals of the one or more switches; and
mode switch-over logic coupled to the terminals of the one or more switches, and including an input coupled to an output of the PWM signal generator.

2. The voltage converter of claim 1, further comprising a slope compensator having at least one input coupled to at least one output of the window generator, and at least one output coupled to at least one input to the window comparator.

3. The voltage converter of claim 1, wherein the mode switch-over logic further comprises a PWM rising edge detector having an input and an output;
wherein the input of the PWM rising edge detector is coupled to at least one output of the PWM signal generator; and
wherein the output of the PWM rising edge detector is coupled to the window generator.

4. The voltage converter of claim 3, wherein the window generator comprises:
a window voltage generator; and
a frequency compensator including at least one input coupled to an output of the PWM rising edge detector, and coupled to the window voltage generator.

5. The voltage converter of claim 4, wherein the window voltage generator includes at least one input coupled to an input voltage node of the voltage converter, an output voltage node of the voltage converter, and an output node of the frequency compensator.

6. The voltage converter of claim 5, wherein the window voltage generator comprises:
a voltage scaler including at least one input coupled to the input voltage node and the output voltage node;
a window transconductance amplifier including at least one input coupled to an output of the voltage scaler; and a current mirror coupled to the window transconductance amplifier.

7. The voltage converter of claim 1, further comprising:
gate control logic including at least one input coupled to at least one output of the PWM signal generator; and
a driver coupled the gate control logic.

8. The voltage converter of claim 7, further comprising at least one power transistor coupled to the output of the driver.

9. A method of operation of a current mode voltage converter, comprising:
determining a duty cycle of a PWM signal;
obtaining a positive window threshold and a negative window threshold;
operating in a valley current control mode when the duty cycle is greater than fifty percent; and
operating in a peak current control mode when the duty cycle is less than fifty percent, including:
commencing a PWM pulse upon an occurrence of a pulse of a first clock signal pulse; and
terminating the PWM pulse upon a level of a signal exceeding the positive window threshold.

10. The method of claim 9, further comprising:
increasing inductor current when the PWM pulse commences;
decreasing the inductor current when the PWM pulse terminates; and
wherein the signal is one of a signal representative of the inductor current, a signal emulating the inductor current, and a signal representative of a current flowing through a power transistor.

11. The method of claim 10, wherein the inductor current respectively increases and decreases linearly.

12. The method of claim 10, wherein the commencing and terminating of the PWM pulse respectively turns on and off one of one power transistor or two power transistors.

13. A method of operating a current mode voltage converter, comprising:
determining a duty cycle of a PWM signal;
obtaining a positive window threshold and a negative window threshold;
operating in a peak current control mode when the duty cycle is less than fifty percent;
operating in a valley current control mode when the duty cycle is greater than fifty percent, including:
commencing a PWM pulse upon a level of a signal being less than the negative window threshold; and
terminating the PWM pulse upon the occurrence of a pulse of a second clock signal.

14. The method of claim 13, further comprising generating the pulse of the second clock signal after a fixed period of time after the occurrence of a pulse of a first clock signal.

15. The method of claim 13, further comprising:
increasing inductor current when the PWM pulse commences; and
decreasing the inductor current when the PWM pulse terminates;
wherein the negative window threshold is a negative window offset voltage; and
wherein the signal is one of an inductor current sense signal representative of the inductor current, or a signal emulating the inductor current, or a signal representative of a current flowing through a power transistor.

16. The method of claim 14, wherein the inductor current respectively increases and decreases linearly.

17. The method of claim 14, wherein the commencing and terminating of the PWM pulse respectively turns on and off one of one power transistor or two power transistors.

* * * * *